United States Patent
Lang et al.

(10) Patent No.: US 6,879,939 B1
(45) Date of Patent: Apr. 12, 2005

(54) CONTROL OF DISTRIBUTION OF INPUT/OUTPUT OPERATIONS DURING SYSTEM TESTING

(75) Inventors: Michelle J. Lang, Minneapolis, MN (US); William Judge Yohn, Shoreview, MN (US)

(73) Assignee: Unisys Corporation, Blue Bell, PA (US)

( * ) Notice: Subject to any disclaimer, the term of this patent is extended or adjusted under 35 U.S.C. 154(b) by 50 days.

(21) Appl. No.: 10/330,972

(22) Filed: Dec. 27, 2002

(51) Int. Cl.[7] .............................................. G06F 15/16
(52) U.S. Cl. ....................................... 702/186; 709/229
(58) Field of Search ................ 702/186, FOR 170–171; 370/229, 236, 394; 710/1, 2, 4, 5, 15, 33; 709/229, 225; 714/33, 38, 39, 46, 48

(56) References Cited

U.S. PATENT DOCUMENTS

| | | | | |
|---|---|---|---|---|
| 5,659,794 A | * | 8/1997 | Caldarale et al. .............. | 710/1 |
| 5,675,772 A | * | 10/1997 | Liu et al. ....................... | 703/27 |
| 5,682,551 A | * | 10/1997 | Pawlowski et al. ........... | 710/36 |
| 5,737,520 A | * | 4/1998 | Gronlund et al. ............. | 714/39 |
| 6,098,114 A | * | 8/2000 | McDonald et al. ............ | 710/5 |
| 2002/0116555 A1 | * | 8/2002 | Somer et al. .................. | 710/26 |
| 2002/0138669 A1 | * | 9/2002 | Kadatch et al. ................ | 710/5 |
| 2003/0061362 A1 | * | 3/2003 | Qiu et al. .................... | 709/229 |

* cited by examiner

Primary Examiner—Carol S Tsai
(74) Attorney, Agent, or Firm—Mark T. Starr; Charles A. Johnson; Crawford & Maunu PLLC

(57) ABSTRACT

A method and apparatus for controlling a distribution of sizes of input/output (I/O) operations in testing a data processing system. A plurality of I/O operations of different sizes are issued in response to a set of distribution parameter values. Each distribution parameter value specifies a number of I/O operations to issue for one or more sizes of I/O operations. The I/O operations are verified for correctness after completion. While issuing the I/O operations, performance characteristics of the data processing system are measured. In response to the performance characteristics relative to target performance characteristics, the distribution parameter values are selectively adjusted.

16 Claims, 5 Drawing Sheets

| distribution table | | | | | |
|---|---|---|---|---|---|
| normal | 1 | 3 | 7 | 3 | 1 |
| inverted normal | 7 | 3 | 1 | 3 | 7 |
| uniform | 1 | 1 | 1 | 1 | 1 |
| positive skew | 1 | 2 | 5 | 7 | 10 |
| negative skew | 10 | 7 | 5 | 2 | 1 |
| random | 3 | 11 | 1 | 4 | 2 |

FIG. 1A

| I/O buffer size ranges | | | | |
|---|---|---|---|---|
| buffer range$_1$ | buffer range$_2$ | buffer range$_3$ | buffer range$_4$ | buffer range$_5$ |

FIG. 1B

| I/O request packet size ranges | | | | |
|---|---|---|---|---|
| packet range$_1$ | packet range$_2$ | packet range$_3$ | packet range$_4$ | packet range$_5$ |

FIG. 1C

CONTROL OF DISTRIBUTION OF INPUT/OUTPUT OPERATIONS DURING SYSTEM TESTING

FIELD OF THE INVENTION

The present invention relates to control of distribution of input/input operations in testing a data processing system.

BACKGROUND OF THE INVENTION

Computer system testing generally seeks to uncover design and implementation errors by creating processing conditions that attempt to replicate real-world conditions. Oftentimes the time and resources required to adequately test a system are strained because of product delivery commitments. Thus, developing automated test suites with thorough coverage of system functionality is very important.

One system-level function that is usually the object of a system test is input/output (I/O) processing. I/O testing often involves controlling I/O load and profile distributions in order to detect and diagnose timing, combinatorial, or random system problems without sacrificing test coverage or test functionality. Some testing techniques may be too repetitive, too random, or introduce too much overhead to produce certain test conditions.

Previous test efforts have focused on executing discrete functional tests, either individually or in random combinations with the objective of producing system-load conditions that would exacerbate system design failures. The result of these efforts was to produce a system load that either followed a specific set of characteristics or was generally random. Repetitive tests produce only a limited set of test conditions, and random activities sometime require too much time to detect even a limited number of combinatorial errors. Relatively less effort has been expended in developing I/O load distributions that are predictable and varied as a means to induce aberrant system behavior and identify logical design or implementation errors.

A method and apparatus that addresses the aforementioned problems, as well as other related problems, are therefore desirable.

SUMMARY OF THE INVENTION

In various embodiments, the invention controls a distribution of sizes of input/output (I/O) operations in testing a data processing system. A plurality of I/O operations of different sizes are issued in response to a set of distribution parameter values. Each distribution parameter value specifies a number of I/O operations to issue for one or more sizes of I/O operations. The I/O operations are verified for correctness after completion. While issuing the I/O operations, performance characteristics of the data processing system are measured. In response to the performance characteristics relative to target performance characteristics, the distribution parameter values are selectively adjusted.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which:

FIG. 1A illustrates a distribution table used in one embodiment of the invention;

FIG. 1B illustrates a table that specifies size ranges of I/O operations;

FIG. 1C illustrates a table that specifies size ranges of I/O request packets;

DETAILED DESCRIPTION

Figure 2A:
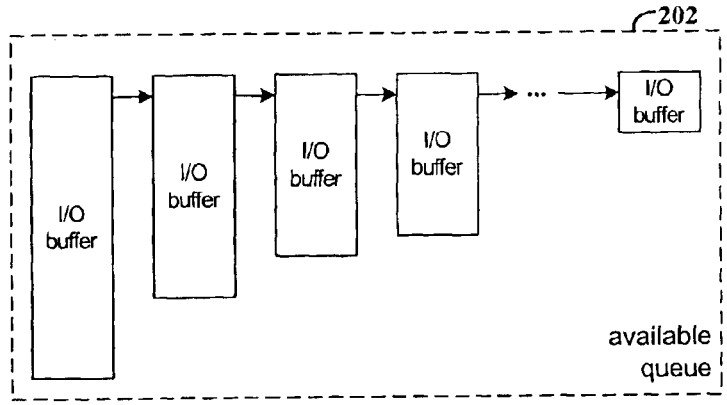
FIG. 2A is a block diagram that illustrates an available queue in which are gathered I/O buffers that are available for use for I/O operations.

The various embodiments of the invention provide a user with control over the number of I/O operations of different sizes that are issued during a test. In addition, distributions are automatically generated based on system performance characteristics in order to assist the user in generating test scenarios.

The embodiments of the present invention are described with reference to a specific data processing system and I/O subsystem, the 2200 series systems from Unisys. Those skilled in the art will appreciate, however, that the teachings of this description could be applied to I/O subsystems of data processing systems with architectures different from the 2200 series systems.

In issuing I/O operations, the example I/O subsystem in the present description uses two data structures that are maintained in the address space of a user program. The two data structures are referred to as the I/O request packet and I/O buffer. The I/O request packet includes control data that the system uses to process the I/O operation, and the I/O buffer includes the data that is to be written to a peripheral device or provides space to which data read from a peripheral device are to be written.

In addition to supporting normal I/O operations that involve reading data from contiguous memory locations for output and writing input data to contiguous memory locations, systems such as the 2200 series systems support write operations that involve reading noncontiguous groups of contiguous data from memory and providing the data for contiguous storage by a peripheral device. The reverse is also supported. That is, data stored contiguously on a peripheral device may be the target of a read operation that specifies writing the data to noncontiguous groups of contiguous locations in memory. For example, an I/O write operation may read data from memory locations 100-127, 200-227, 300-327 and 400-427 and write 112 contiguous words to mass storage starting at a specific mass storage location. The reverse would also be possible. These types of operations are supported by a set of access control words (ACWs) in an I/O request packet. Each ACW references a memory location and a word count. The memory location is the address at which data are to be read/written, and the word count specifies the number of words to be read/written from/to that location.

In support of controlling the distribution of sizes of I/O operations in an I/O test, one embodiment of the invention provides multiple definitions of distributions. Generally, each distribution defines numbers of I/O operations of different sizes that are to be issued in the test. In a more specific embodiment, each distribution defines a number of I/O operations within different ranges of sizes of I/O operations. FIGS. 1A, 1B, and 1C illustrate three tables used in the different embodiments to control the distribution of sizes of I/O operations.

FIG. 1A illustrates a distribution table 102 used in one embodiment of the invention. I/O operations are issued in accordance with a selected distribution of sizes of I/O operations. A row of values defines a distribution of sizes, and each value in the distribution table indicates the number of I/O operations that are to be issued for I/O operations of a size that falls within a range of sizes associated with the value.

Different distributions are defined in the distribution table. The example table includes specifications for a normal, inverted normal, uniform, positive skew, negative skew, and random distributions. Each distribution is specified with five values with each value associated with a range of sizes. For example, the normal distribution specifies 1 I/O operation within a first size range, 3 I/O operations within a second size range, 7 I/O operations within a third size range, 3 I/O operations within a fourth size range, and 1 I/O operation within a fifth size range. In the example embodiment, the ranges specify increasing sizes of I/O buffers from the first range to the fifth range. Other embodiments may have the ranges specify decreasing sizes of I/O buffers from the first range to the fifth range, have more or fewer numbers of ranges, and have other types of distributions.

FIG. 1B illustrates a table 112 that specifies size ranges of I/O operations. The size of the address space that is available for use in testing I/O operations is divided into a selected number of ranges, with the number of ranges being equal to the number of entries in a row of the distribution table 102. In one embodiment, each range spans the same number of words. For example, if for purposes of illustration the total range of sizes is from 1 to 1000 words, then the sizes in the first range are from 1 to 200 words, the sizes in the second range are from 201 to 400 words, the sizes in the third ranges are from 401 to 600, the sizes in the fourth range are from 601 to 800, and the sizes in the fifth range are from 800 to 1000. Other embodiments may have ranges of unequal sizes.

FIG. 1C illustrates a table 122 that specifies size ranges of I/O request packets. Each range of request packet sizes indicates the range of the number of access control words that may be included in an I/O request packet. In one embodiment, each range spans the same number of access control words. Other embodiments may have ranges of unequal sizes.

Figure 2B:
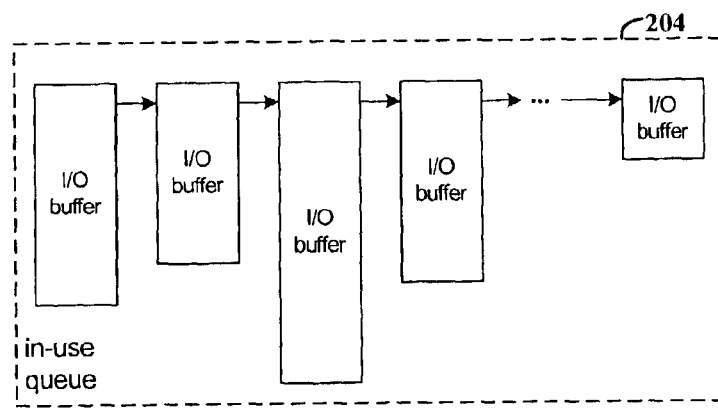
FIG. 2B is a block diagram that illustrates an in-use queue in which are gathered I/O buffers that are being used for I/O operations that are in process.
Figure 2C:
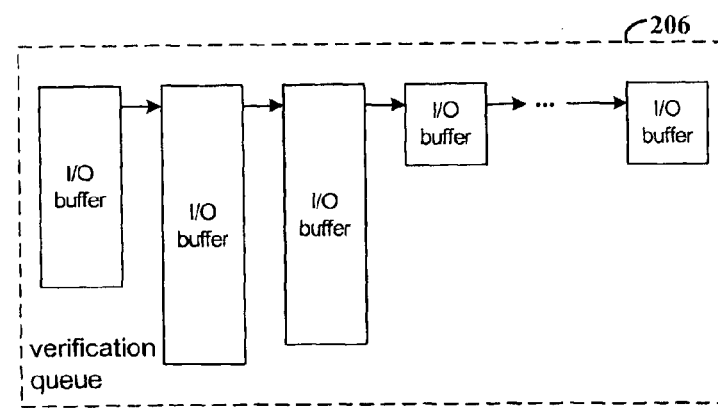
FIG. 2C is a block diagram that illustrates a verification queue in which are gathered I/O buffers that are being used for I/O operations for which verification of data is required.

In an example embodiment, the ranges in the buffer size range table 112 and packet size range table are determined based on user input values. For example, the buffer size ranges are determined based on user input of the smallest transfer size and the greatest transfer size for the test. Similarly, user input values of the smallest packet size and the greatest packet size are used to determine the size ranges of the I/O request packets In one embodiment, the test process uses queue structures to manage the I/O buffers and I/O request packets. FIG. 2A is a block diagram that illustrates an available queue 202 in which are gathered I/O buffers that are available for use for I/O operations; FIG. 2B is a block diagram that illustrates an in-use queue 204 in which are gathered I/O buffers that are being used for I/O operations that are in process; and FIG. 2C is a block diagram that illustrates a verification queue 206 in which are gathered I/O buffers that are being used for I/O operations for which verification of data is required. Corresponding available, in-use, and verification queues of I/O request packets are used in conjunction with the I/O buffer queues in processing I/O operations. However, the request packet queues are not illustrated because of the similarity to the buffer queues.

At test initialization, I/O packets and I/O buffers are allocated, initialized and placed on the respective available queues. The buffers and packets are placed on the available queues in order of size, with the smallest buffer/packet at the head of the queue and the largest buffer/packet at the tail of the queue. In one embodiment, allocation starts with the smallest or $1^{st}$ size group and proceeds toward the largest size group. In other embodiments, the order of selection may be varied to achieve different design objectives. During the process of issuing I/O operations, the test attempts to find an I/O packet and I/O buffer of the appropriate size on the respective available chains. If a suitable buffer and packet are found, the packet is updated with the appropriate information such as transfer count and I/O function. The I/O operation is then issued and the I/O packet and buffer are removed from the available queues and placed on the respective in-use queues. If a suitable packet/buffer combination is not found on the available chain, the in-use chain is monitored for completed I/O packets for which data verification has not been selected. If data verification has been selected, completed I/O packets are moved to the verification queue for processing prior to being returned to the available queue.

Figure 3:
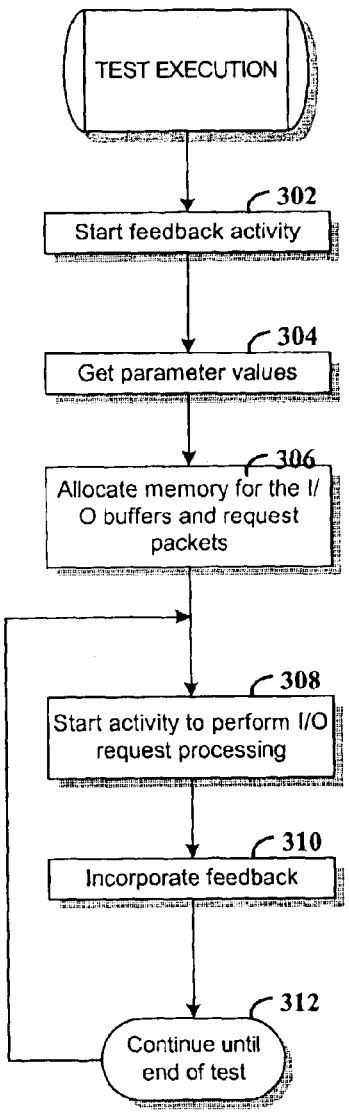
FIG. 3 is a flowchart of an example process for executing a test in accordance with one embodiment of the invention.

FIG. 3 is a flowchart of an example process for executing a test in accordance with one embodiment of the invention. A main test execution process controls the selection of a distribution type. Feedback of system operational characteristics is used to adjust the test characteristics in order to develop desirable parameter values and achieve certain test objectives. The feedback information is gathered by a feedback activity which is started at test initiation (step 302).

Figure 5:
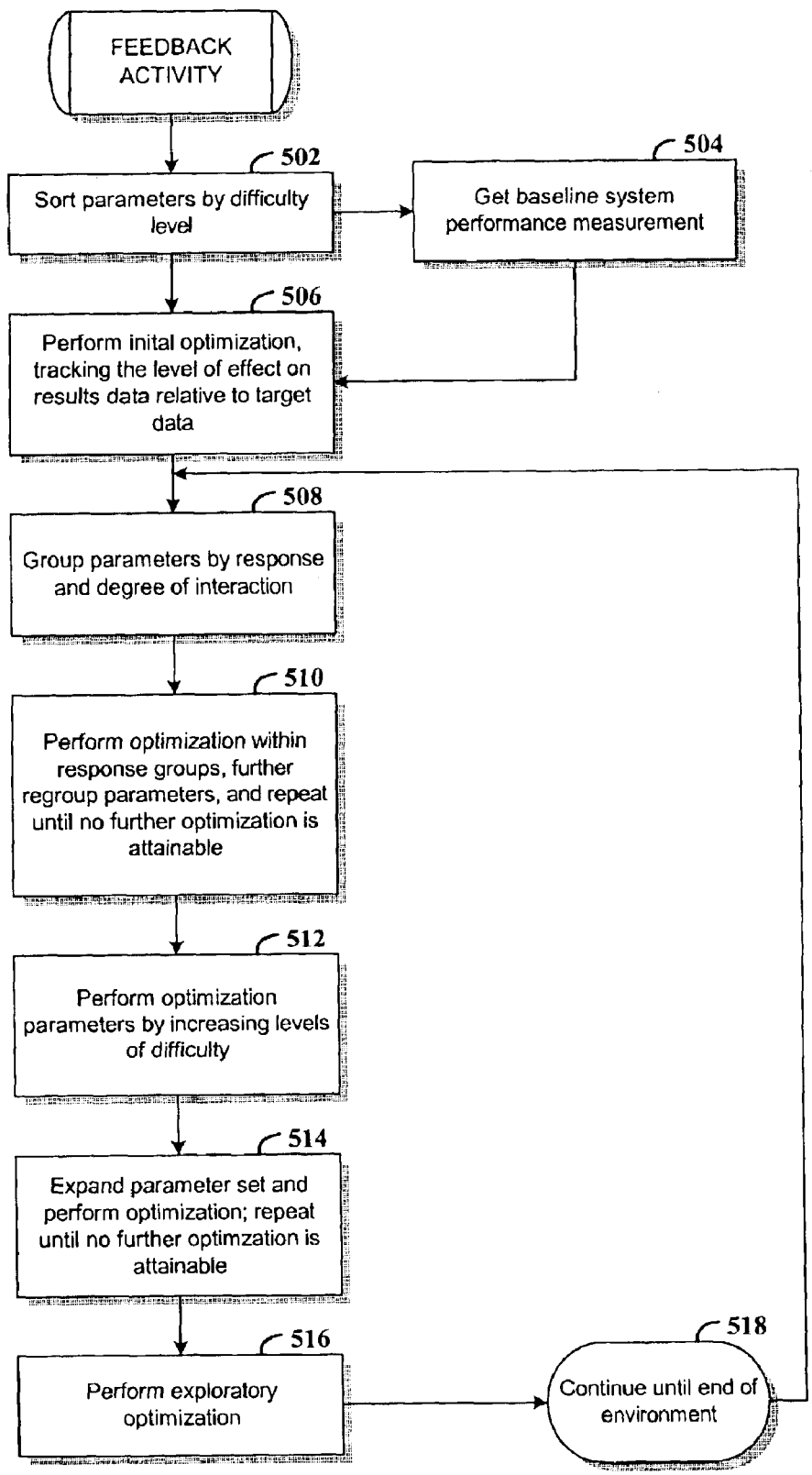
FIG. 5 is flowchart of a process performed by a feedback activity.

The feedback activity monitors system performance characteristics and adjusts parameter values in order to achieve a certain test objective (FIG. 5). The feedback activity is used to evolve parameter sets. Further information on evolving parameter sets is found in the following patents/applications: "METHOD AND SYSTEM FOR TESTING A COMPUTING ARRANGEMENT" by Lang et al., filed on Jun. 6, 2002, having patent/application Ser. No. 10/164,877, and "METHOD AND SYSTEM FOR GENERATING SETS OF PARAMETER VALUES FOR TEST SCENARIOS" by Lang et al., filed on Jun. 6, 2002, having patent/application Ser. No. 10/165,506. The contents of these patents/applications are incorporated herein by reference. The test execution process incorporates changes to the parameters before continuing with the remainder of the test.

The initial parameter values are obtained when commencing a test (step 304). Example parameter values include the mass storage file size, the number of mass storage files on a given device, the number of mass storage devices on a given channel, the number of I/O channels in the system, minimum and maximum I/O transfer sizes for each I/O operation, minimum and maximum numbers of ACWs per I/O operation, the file access methodology (sequential or random), and the I/O function (reads vs. writes).

After getting the parameters values, the process allocates memory for the I/O buffers and I/O request packets to be used by the test (step 306). The amount of memory available for allocation is determined according to the system architecture and the amount of memory required by other parts of the test process. The activity that issues the I/O requests is started (step 308) after the memory is allocated in an example implementation. In one implementation the main activity will issue the I/O operation after allocating memory and creating I/O buffers/packets. In another implementation, a separate activity will be created to schedule I/O operations. While I/O requests are being issued, the feedback activity adjusts parameter values based on performance characteristics of the system. At a test-specific point in test execution, the new parameter values are incorporated into the test process (step 310) and are acted on in continuing the test (step 312).

Figure 4:
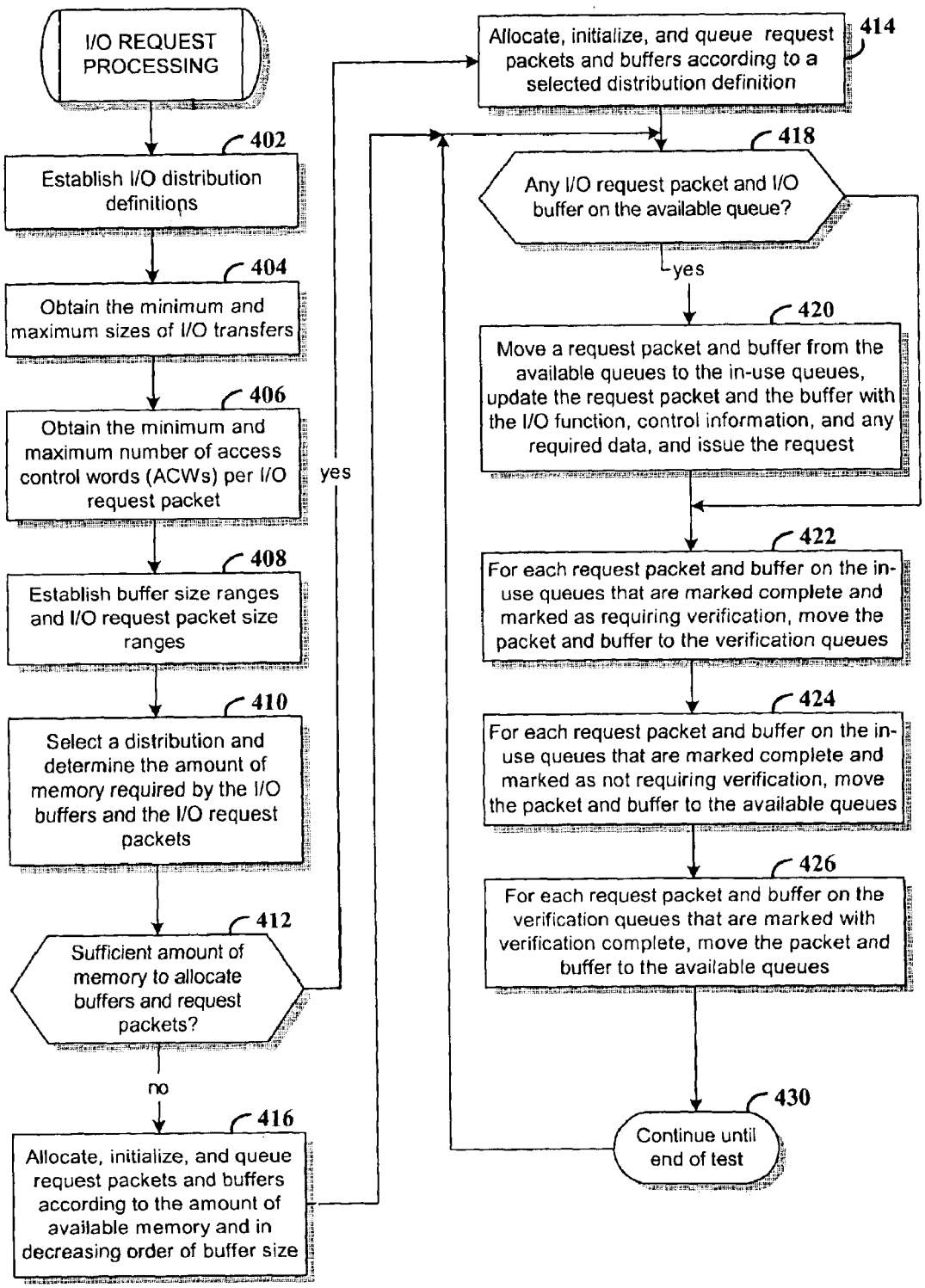
FIG. 4 is a flowchart of an example process for processing I/O requests in accordance with one embodiment of the invention.

FIG. 4 is a flowchart of an example process for processing I/O requests in accordance with one embodiment of the invention. In processing I/O requests the process establishes different distribution definitions which maybe used in the test (step 402). In one embodiment, the definitions are hard-coded into the test program. In another embodiment, the distribution definitions may be entered by a user a test initiation.

The process also obtains the minimum and maximum values for both the size of I/O transfers (step 404) and the number of ACWs for each I/O packet (step 406). In one embodiment, the values are taken from user input to the process. The size ranges of the I/O buffers and I/O request packets are determined based on the minimum and maximum values (step 408). In an example embodiment, the buffer size ranges include 5 ranges of equal size spanning from the minimum specified size to the maximum specified size.

A selected one of the distribution definitions is used to determine the amount of memory required for the test (step 410). The space required is the sum of the space required by the I/O buffers plus the space required by the I/O request packets. An example computation of the space required by the I/O buffers, assuming the normal distribution (from FIG. 1A), 5 ranges of equal size, the minimum to maximum sizes of I/O transfers is from 1 word to 1000 words, and each I/O buffer includes a 4-word header is:

$$((200+4)*1+(400+4)*3+(600+4)*7+(800+4)*3+(1000+4)*1)=9060 \text{ words}$$

An example computation of the space required by the I/O request packets assuming, in addition to the assumptions above, that each request packet size is 13 words, and the minimum to maximum number of ACWs per I/O request packet is from 1 to 500 with 1 ACW per word is:

$$((100+13)*1+(200+13)*3+(300+13)*7+(400+13)*3+(500+13)*1)= 4695 \text{ words}$$

The total space required by the I/O buffers and request packets is: 9060+4695=13,755 words.

If there is sufficient memory available to allocate the number of I/O buffers and I/O request packets specified by the selected distribution (decision step 412), the process allocates, initializes, and queues the request packets and buffers in the available queue 202 according to the selected distribution (step 414). The request packets and buffers that are allocated are of the maximum size within the respective ranges. This effectively proportionally regulates the number of I/O operations of a given size without incurring the overhead associated with allocating each buffer dynamically in accordance with a selected algorithm. This reduces the time required to find resources for specific algorithms because the resources are preallocated to the operations in proportion to the selected distribution.

If there is insufficient memory available to accommodate the number of I/O buffers and I/O request packets required by the distribution, the selected distribution is disregarded and the I/O buffers and request packets are established in order of decreasing size (step 416) with the space available. If space is available for an I/O buffer and an I/O request packet of the largest size, one buffer and one packet are initialized and queued. The process then proceeds to the next lower size range and checks whether there is sufficient space for allocating a packet and buffer of the maximum size in this range. If space is available, the packet and buffer are initialized and queued, and the process proceeds to the next lower stage. This process continues until no further buffers and packets of any size can be created.

After the I/O request packets and I/O buffers have been initially queued, the process commences issuing the I/O operations. If there are an I/O buffer and an I/O request packet on the respective available queues (decision step 418), an available request packet and an available buffer are updated according to the I/O operation to be performed and moved to the respective in-use queues (step 420). Once moved, the I/O operation is issued. It will be appreciated that the specific I/O function and data to be read or written are test dependent. Most systems support simultaneous outstanding I/O operations by a single program activity. This is referred to as asynchronous I/O. When a program issues an asynchronous I/O operation, the operating system accepts the operation for processing and immediately returns control to the user program. Processing of the operation will complete at some time after control is returned to the issuing program.

The process continues with further processing of packets and buffers in the in-use and verification queues. For each request packet and buffer in the in-use queue that are marked as complete and requiring verification, the packet and buffer are moved to the respective verification queues (step 422). For each request packet and buffer in the in-use queue that are marked as complete and not requiring verification, the packet and buffer are moved to the respective available queues (step 424). For each request packet and buffer on the verification queue that are marked as verification complete, the packet and buffer are moved to the respective available queues (step 426). A separate verification activity (not shown) processes packets and buffers on the verification queue and in need of verification. The verification activity monitors the verification queues for packets and buffers in need of verification, performs test-specific verification of the I/O operations (e.g., data comparison), and marks packets and buffers as verification-complete when the verification is done.

The general parameters that are involved in determining system I/O characteristics are somewhat platform and mass storage complement dependent. For example, if a global caching subsystem is present much of the system I/O will be to files that are resident in that global cache. In general the major parameters that affect the system's I/O profile include: the mass storage file size, the number of mass storage files on a given device, the number of mass storage devices on a given channel, the number of I/O channels in the system, the I/O transfer size per I/O operation, the number of ACWs per I/O operation, the file access methodology (sequential or random), and the I/O function —I/O reads and writes take different amounts of time.

The mass storage file size affects the overall I/O throughput since more consecutive read or write operations can take place before the device's read/write head must be completely repositioned (which incurs a considerable time penalty). The number of mass storage files on a given device may increase its queuing times thus causing a decrease in overall throughput. However, depending on file placement it may also increase I/O throughput due to electronic head switching versus head movement times on multi-head devices. The number of devices on a given I/O channel increases the ability of a channel to transmit data up to the point where the channel becomes saturated. If one device on a channel is moving its head mechanism to access a file, another device on that same channel can be transmitting data. This generally provides for a higher degree of channel utilization. The number of independent I/O channels provides the obvious benefit of increasing the number of simultaneous I/O operations that can take place in the system. The I/O transfer size is important in that a single large I/O operation generally takes less time than a number of smaller I/O operations. This is due to having a single I/O packet to process for a given data transfer as opposed to multiple packets for smaller I/O operations. The number of ACWs affects the system I/O throughput due to the ability to access different areas of memory for a given I/O transfer size. Sequentially accessing a mass storage file has the advantage of minimizing the read/write head movement for a given I/O transfer size. The I/O function can affect the overall system I/O throughput due to the fact that read and write operations require different amounts of time to process.

While each of the aforementioned parameters may be varied during the course of execution, some are only varied at specific times due to the overhead incurred as a result of the change. Cataloging or deleting new mass storage files are parameters for which changes are incorporated at the beginning and end of a specific set of parameter values. The test feedback mechanism maybe adapted to adjust any or all of the above parameters during the course of test execution depending on the goals of the specific test.

While each system platform has specific I/O characteristics that can be monitored for feedback purposes, the following characteristics tend to be common across various system architectures. Almost every system allows the minimum, maximum and average number of transferred read and write data units to be monitored. Most often these numbers can be on a per device basis or a system wide basis. The amount of device queuing on a per device basis is normally measurable as well. Some systems, like the UNISYS 2200, allow some numbers to be monitored on a per channel basis. The individual characteristics of an I/O operation, like device latency, can also be monitored. The amount of CPU time and memory being utilized can also be obtained. Depending on the goal of the specific test session, any or all of the aforementioned measurements can be utilized by the feedback mechanism to achieve the desired goal.

FIG. 5 is a flowchart of a process performed by a feedback activity. The feedback activity routine attempts to find the parameter values that come closest to achieving a system-level test objective and attempts to do so in a minimal amount of time. During optimization, the feedback activity concentrates on those parameters that appear to have the largest positive influence (relative to the system-level goal) on the system behavior. Less time is spent adjusting parameters that have been found to have insignificant or negative affects on the outcome. Parameters that require large amount of time or overhead to change are also adjusted less frequently than other more responsive parameters. The particular parameters selected for adjustment depend on the current test objective and the platform parameters that are available for measurement. For example, if the current test objective is to verify data coherency while maximizing main memory access via I/O operations, some of the parameters that might be adjusted include:

1. I/O transfer size—the size of the I/O transfers to/from memory directly affect the overall number of I/O data units transferred to memory per unit of time;
2. CPU involved with I/O operations—the number and architectural location of the CPUs involved in updating I/O buffers and scheduling I/O operations has a direct impact on the overall data transfer rate;
3. Ratio of read to write functions —I/O and CPU read and write functions have different time requirements, which directly affects the memory data transfer rate;
4. Number of ACWs per I/O transfer—this number can directly affect I/O to memory data transfer by altering the amount of memory conflict that occurs;
5. I/O distribution—the type of I/O distribution directly affects the I/O to memory data transfer by altering the device queuing and memory conflicts that occur; and
6. File access order—the order in which individual data files are accessed directly affects device queuing and service time, consequently influencing the amount of I/O data that can be transferred per unit of time.

Each of these parameters has a direct impact on the memory data transfer rate and access concurrency that take place across the entire range of the memory partition by multiple requesters, as well as the read operations that are necessary to verify data coherency.

Once an initial parameter set has been identified, and baseline measurements have been taken, the feedback activity can begin to make adjustments. The point at which changes to parameter values are incorporated in the executing test is determined by the speed with which the executing code can both recognize and respond to the changes.

When choosing which parameter values to adjust, the feedback activity follows these general rules: 1) values of critical parameters are not changed; 2) the type of the parameter (fixed, restricted, unrestricted) is maintained wherever possible; 3) random parameters are not changed to another type (except under special conditions); 4) changes are made in progressive increments, attempting to remain as close to the original focus area as possible; 5) values of parameters that are more easily acted on by the test execution unit(s) are changed first; and 6) parameter values are selected with the intent of getting closer to the system level goal. Further explanation of the various types of parameters (e.g., critical, fixed, restricted, and unrestricted), as well as focus area are found in the referenced patents/applications.

The parameter definitions further include information that indicates levels of difficulty ("difficulty levels") associated with changing the parameter type and the parameter value relative to incorporation by a test execution unit. This information is used to assess how difficult, how quickly, and at what level a parameter can be adjusted during execution. For example, in 2200 systems, assigning files and creating new processes involve different levels of system overhead. Thus, parameters associated with assigning files will have a different difficulty level than parameters associated with creating new processes. The difficulty levels are assigned by a user.

The number of difficulty levels that are defined and the criteria used for assigning parameters to these levels are implementation dependent. In one embodiment, parameters at the highest difficulty level require significant time and/or overhead to change. For example, changes to a parameter having a high difficulty level may require that execution be temporarily halted or require that changes be made only by the test execution engine, and only at specific times during execution.

Parameters having the lowest difficulty levels, on the other hand, require no special setup. These parameters can be adjusted at any time, and are frequently reread in the main-path of a test execution unit. Generally, parameters having higher difficulty levels are adjusted less frequently than parameters having lower difficulty levels.

In one embodiment, the difficulty levels are divided into two measures. One measure relates to the difficulty involved in reducing the current value of the parameter. The other relates to the difficulty involved in increasing the current value of the parameter. For example, marking a file invalid in a file table for the parameter of the number of target files requires relatively low overhead. However, assigning a new file requires significantly more overhead and can only be accomplished at relatively infrequent intervals during test execution for parameters such as the number of files/device or total number of files.

The parameter type indicates whether the parameter is a fixed value parameter, a restricted range parameter, or a random parameter. The type is not intrinsic to the parameter, but is determined by initial settings. The feedback activity attempts to maintain the parameter type during the course of execution. Fixed parameters remain fixed, restricted range parameters remain restricted range, and random parameters remain random whenever possible.

In addition to the parameter types of fixed, random, and restricted range, parameters can be further subdivided according to the type and number of allowable values. Parameter types refer to the current or assigned parameter values whereas value types refer to the allowable values and methodology for a parameter's modification. In the example embodiment, each parameter can be assigned a value type of discrete range, continuous range, or limited choice. Discrete range parameters are characterized by a relatively small number of possible values. Typically, a discrete range parameter would have less than a hundred possible discrete values. When adjusting discrete range parameters, changes are made incrementally and follow the path of positive change, should one exist. This is based on an initial assumption that the parameter has a linear, exponential, or otherwise continuously increasing, relationship to system behavior. During later optimization stages, when optimization along these lines is no longer possible, deviations from this incremental approach will be allowed.

Continuous range parameters, although not necessarily mathematically continuous, have a sufficiently large number of possible values that attempting them all is not possible. In addition, minor variations typically have little effect. For example, in adjusting the word count in data transfers the range of allowable values is quite large and variations in system behavior when adjusting the value by only a few words is not expected to be significant. When adjusting parameters of this type, a variant of the divide-and-conquer approach is used. The initial value is used to logically divide the range into two portions, and a measurement from each portion is taken. The best measurement becomes the basis for subdividing the portion in which it belongs into two new portions. The process of subdividing the range is repeated until no further progress is made, or the range has reached some minimum size.

Limited choice parameters have a fixed, small number of choices, for example, not more than four or five different values. In addition each different value has unknown effects on the system. For example, finding that an improvement occurred when changing from a first algorithm to a second algorithm allows no prediction as to the effect of changing from the second algorithm to a third algorithm. When selecting values for parameters of this type, each value is selected in turn. Selections can be made in any order. An example limited choice parameter is a workload distribution algorithm.

The feedback activity begins by sorting parameters by difficulty level (step 502), and then obtains baseline system performance measurements (step 504). Assuming three levels of difficulty, parameters are divided into three groups. Groups may include a combination of fixed value, restricted range, or randomly generated parameters depending on the associated difficulty levels. Critical parameters are not included, as they represent parameters that may not be adjusted.

Random (unrestricted) parameters are established as such because these parameters are expected to have an insignificant effect on the ability of the environment to achieve the associated system-level goal. Thus, random parameters are not optimal candidates for change. However, because interactions of variables cannot always be predicted, some exploration of these parameters is included.

In general, the feedback activity first attempts to optimize the set of parameters at the lowest difficulty level. A set of parameters is considered optimized when changes to any one of the set results in a measurement that is equal to the system-level goal, or as is more likely the case, further from the system-level goal than a previous reading. An individual parameter is considered optimized when both positive and negative changes have an adverse effect on the system measurement. It will be appreciated that the optimization is not absolute, but is dependent on the current values of other environmental parameters.

Once all parameters from the lowest difficulty level have been optimized, a single parameter from the next level of difficulty is selected and the value is adjusted until an optimal value is found. The lowest level parameters are then readjusted until they have been optimized relative to the new parameter value in the next level. This process is repeated until all parameters at the next level have been optimized at least once. Then the parameters at the next level of difficulty are optimized, with re-optimization of parameters at the lower levels with each changed parameter value.

At this stage of optimization, parameters at higher levels of difficulty are optimized individually, and parameters at the lower difficulty level are optimized based on changes at the higher levels. However, the original (higher level difficulty) parameter is not readjusted, or treated as part of this optimization set. This limits the number of changes that are made to higher difficulty level parameters. At some point in optimization there may be a time when no further changes parameter in parameter values can be made that will result in a positive gain. The optimization is then considered stable. At this time, boundaries between difficulty levels are removed, and the parameters are treated as one optimized set. In this way, more interactions between parameters can be explored.

When optimizing a set of parameters, the feedback activity proceeds in several stages. Except for the initial optimization stage, the other stages are repeated. The stages are shown in FIG. 5 and further described in the following paragraphs.

During the initial optimization stage (step 506), each parameter is optimized individually using the initial environment parameter values. The best value for a parameter is found while the current values of all other parameters are fixed. Once all parameters have been optimized once, the process is repeated. Because parameters may interact with each other, a change in one parameter value may mean a new optimal value for another. Recall that when fixed value parameters are adjusted, they are adjusted by assigning another fixed value, ideally a value that results in a measurement closer to the system-level goal. An example of this technique for optimizing a fixed value parameter follows.

Consider the case of a fixed, discrete range parameter with an initial value of 3, and an allowable range of [1, 2, 3, . . . , 10]. The first step in optimizing this parameter is to test the two adjacent values, 2 and 4, for the effects on the system performance measurement, and to record the effects of the change relative to the baseline. The next action depends on whether the change is negative, positive, or there is no change.

For example, if best value is currently 3 and the values 2 and 4 both result in a negative change, this stage of optimization is complete, and another parameter is selected for optimization. The current best parameter value remains 3. Note that it is still possible that this parameter may have a positive effect on the environment at some future time, since changes in other parameters may affect the behavior of this one.

If one of the adjacent values (2 or 4) results in a positive change, and the other results in a negative change, subsequent adjustments to the parameter value selections continue in the direction of the positive change, until such time as no further positive change improvement is observed.

If there is no significant change that results from adjacent values (2 or 4), the next adjacent values are selected (1 or 5). If there is still no change, values at the upper and lower bounds of the range are checked. If there is still no change, the parameter is (temporarily) abandoned, and attention turns to another fixed parameter.

When optimizing limited choice parameters, no direction (in terms of relative values) for improvement is assumed. Each value is selected in turn, and its effect on the system is measured. The value with the best (most positive) effect is the one that is selected. Testing of each value can be terminated prematurely in the event that the value of the parameter appears to have no significant effect on the behavior of the system.

For restricted range parameters, a range is selected instead of a single value. During initial optimization, the size of the range is left unchanged. However, the range is shifted to the right or left (numerically), looking for positive or negative changes in the performance measurement. For a discrete range parameter, the shift is one value to the right (or left). For a continuous range parameter, the shift is a selected percentage of the size of the original range, for example, 50%. As with fixed parameters, the shifts continue in the order of positive change.

After the initial optimization, parameters are grouped by response level and degree of interaction (step 508). As adjustments are made, the feedback activity tracks those parameters that appear to have little affect on the performance measurement, those parameters that cause a negative change, and those parameters that cause a significant positive change. The parameters are then grouped by relative response level and degree of interaction within each difficulty level. Those parameters that cause a positive change are placed in a higher level group within the difficulty level. Parameters that have a strong (positive) interaction with other parameters, in particular, specifically, those that require frequent adjustments on subsequent passes through the parameter list, are also placed in a higher level group. Optimization concentrates on those parameters with the most significant and positive interactions. This reordering and grouping of parameters is dynamic, and may change as new parameters or changes are introduced, and new interactions are found. The number of groups within a difficulty level is implementation specific. At a minimum, three groups would be required, one for parameters with positive responses, one for negative responses, and one for limited response.

Figure 6:
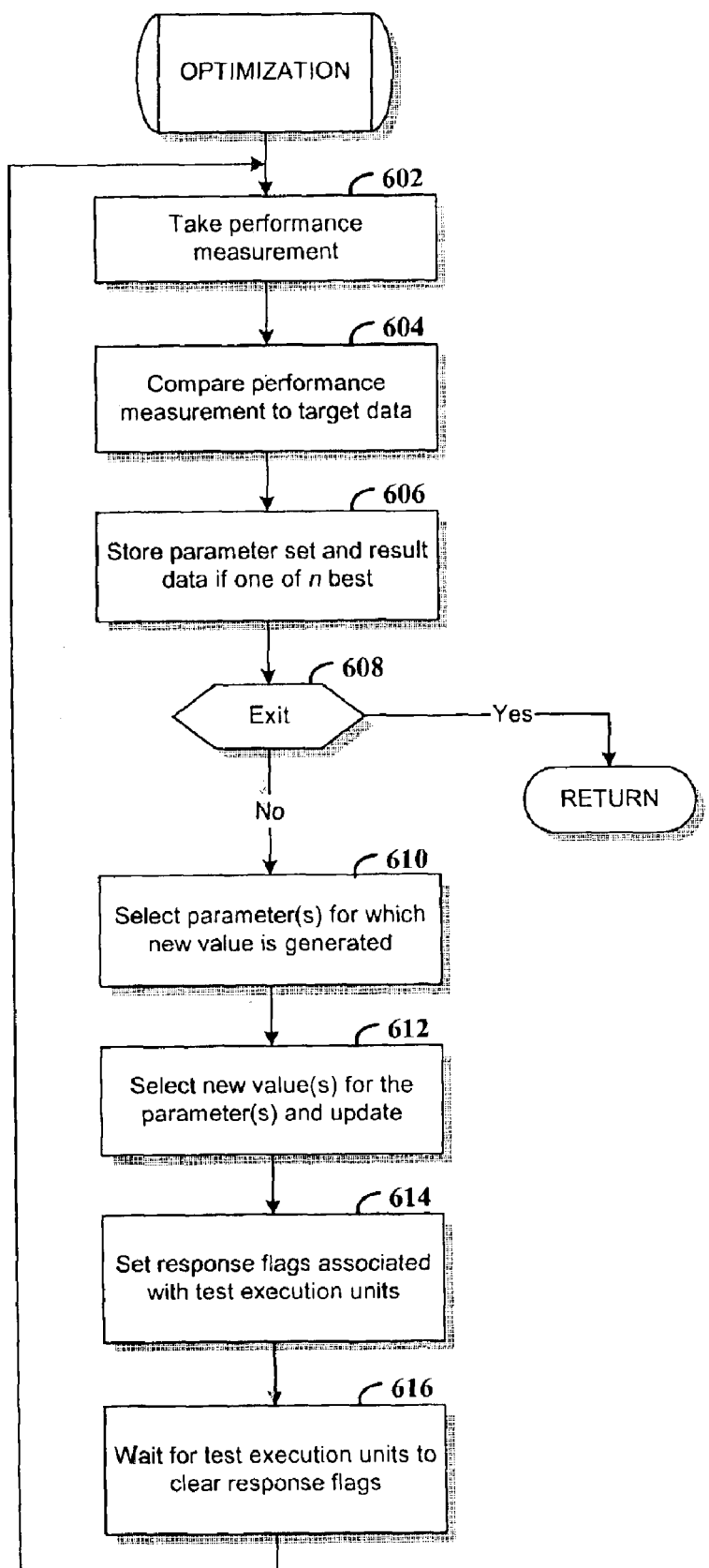
FIG. 6 is a flow chart of a process perform ed by the feedback activity in optimizing a selected parameter value.

Once the parameters have been grouped, optimization is performed within the response groups (step 510). During the initial optimization stage, several passes through the parameters are made. Information gained with each pass through the parameters is used to separate these parameters into groups according to their level of positive response, and degree of interaction with other parameters. The level of positive response is parameter-specific, relative to the system-level goal, and independent of other parameters. The degree of interaction is a quantitative measurement of how other parameter optimizations are affected by a change in a particular parameter value. Once parameters have been separated into groups, optimization begins to concentrate on those parameters that have been found to exhibit the largest positive results. Parameters in higher-level response groups are optimized more frequently than parameters in lower-level response groups. FIG. 6 illustrates an example process performed for optimization.

If optimization of a response group results in no changes, some steps can be skipped. For example, if optimization of a lower-level response group parameters results in no adjustment from the initial value, no optimization of higher-level response groups is required because there was no change in the lower level response group to affect the higher-level response group. In practice, parameters from the limited or negative interaction sets would infrequently result in changes.

The next stage of optimization optimizes parameters in successive increasing levels of difficulty (step 512). The parameters at each level of difficulty are optimized before continuing with parameters at the next level of difficulty. Based on the current optimized selections, a parameter value is adjusted until an optimal value is found. Again, the process of FIG. 6 is used for optimizing the parameters.

The parameter set is expanded and further optimization is performed after optimizing by increasing levels of difficulty (step 514). Optimization of the expanded parameter set occurs when no further optimization progress can be made by separately optimizing difficult parameters. This stage involves treating all parameters, regardless of their difficulty level as a single parameter set. Parameters are sorted into response groups according to the amount of positive influence and degree of interaction with other parameters in the set. Optimization by group continues as described above, until no further progress can be made.

The final stage of optimization is called the exploratory stage (step 514). During this stage, previously unexplored ranges and parameter values are tested in search of a more optimal solution. Less emphasis is placed on maintaining the same degree of environmental focus, and fewer assumptions are made about the individual functional relationships of parameters.

During the exploratory stage values of random parameters are allowed to vary. In addition, the values for one or more parameters are selected at random, from the set of previously unselected values. This defines a new starting point for the optimization. In "hill-climbing" jargon this constitutes finding a new starting position—one that may allow another (higher) peak to be found. In genetic algorithm jargon, genes are allowed to mutate. Depending on the overhead associated with changing values of difficult parameters, this stage may be moved ahead of the optimization of expanded parameter set stage.

There may be a higher degree of instability, and slightly longer periods of negative improvement during this stage than in other optimization stages. However, because no further improvement was attainable in the other stages, the exploration of other sets of parameter values is considered desirable. For example, consider the case of a fixed parameter having a discrete range of values of 1–10 and an initial value of 3, and a local maximum at this point. The initial value 3 is the best value attained from previous optimization stages. During the exploratory stage, a value is selected from the previously unselected values: 4–10. Unselected values are those allowable values that have not been considered in prior stages of the optimization. Each parameter value in a range has a flag that is used to indicate when a value is selected. Values are selected, until one is found that results in a positive change, or some maximum number of non-positive changes have been attempted. In this case, testing each of the endpoints, as well as one value in the range 5–10 may be considered sufficient.

The exploratory stage for a restricted range parameter involves first contracting, then expanding the current range. Contracting a restricted parameter range uses a divide-and-conquer method similar to that described above in association with adjusting continuous range parameter values.

The exploratory stage also allows ranges to expand into previously unexplored areas of the range. For restricted range parameters, the original range is abandoned, and a new, larger range is defined. The new range spans the entire range of defined values for the parameter. The divide-and-conquer method is then used to find some subset of this range that produces results closer to the system level goal being measured.

In the case of a random parameter, the first step is implied, as the range of a random parameter is, by definition, the entire range of parameter values.

Without significant additional overhead, it is possible for the feedback activity to monitor the behavior of the system in other (non-goal) areas. For example, if the system level goal of the environment is to maximize the number of write bytes transferred per second, the feedback activity routine could simultaneously measure the average I/O queue size, the total number of requests per second, and the number of split requests. If desired, separate records could be kept for each of these measurements as well. Parameters are adjusted for maximum bytes per second. However, if during the course of this optimization one of the other measurements was found to exceed the previous "best" measurement, the saved set of parameter values could be updated.

This auxiliary information could be used to supply initial starting parameter values for the environment if the user wishes to override the environment goal. For example, the user may want to verify the integrity of word addressable files under conditions of maximum page faults, rather than maximum I/O volume.

FIG. 6 is a flowchart of a process performed by the feedback activity in optimizing a selected parameter value. The optimization process monitors the performance of the system by taking a performance measurement in a selected area of the system (step 602). The number and type of performance measurements that can be taken to support a given test objective depend on the specific platform under test. Example performance measurements include:

1. (the number of data read requests per requestor—represents the number of read operations made by each requester to cache/memory.
2. (the number of data write requests per requestor—represents the number of data modification requests made by each requestor to cache/memory
3. the number of cache misses per requestor (or cache data fetch operations)—indicates the number of times memory must be accessed to obtain the latest copy of the data; and
4. the number of cache invalidations per requestor—indicates the number of data areas that must be written to memory.

These measurements allow the test to determine the number of memory accesses and by which requestors the memory accesses are made. If it is determined that the access pattern from a number of requestors is causing a high level of cache hits, the processing can be modified to cause requests to be made to memory instead. If it is determined that the ratio of read to write requests is not as desired, the ratio of read and write access functions, along with the designated processors for execution, can be modified to achieve the desired result.

The performance measurement is compared to a target value for the environment (step 604), and the set of parameter values is stored if the performance measurement is one of n best measurements taken (step 606). It will be appreciated that storage of the set of parameter values is made by type of computing arrangement in accordance with one embodiment of the invention.

If the optimization process determines that either performance measurement has reached a desired level or that no further progress is expected (decision step 608), the process returns control to the feedback activity of FIG. 5. Otherwise, one or more parameters are selected for generation of new parameter values (steps 610, 612). The response flags associated with the changed parameter values are set for the test execution units (step 614). When all the test execution units have responded by clearing the respective response flags (step 616), the optimization process returns to take another performance measurement (step 602).

Accordingly, the present invention provides, among other aspects, a method and apparatus for verification of data coherency. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for controlling a distribution of sizes of input/output (I/O) operations in testing a data processing system, comprising:

instantiating a plurality of sets of distribution parameter values, wherein the values in each set define a distribution that is unique relative to the other sets of values;

issuing a plurality of I/O operations of different sizes in response to one of the sets of distribution parameter values, wherein each distribution parameter value specifies a number of I/O operations to issue for one or more sizes of I/O operations;

verifying correct completion of the I/O operations;

measuring performance characteristics of the data processing system while issuing the I/O operations; and selectively adjusting, in response to the performance characteristics relative to target performance characteristics, the distribution parameter values, the selective adjustment including selecting one of the sets of distribution parameter values in response to the performance characteristics relative to target performance characteristics.

2. The method of claim 1, wherein each distribution parameter value is associated with a range of sizes of I/O operations.

3. The method of claim 2, wherein each range of sizes spans an equal number of words.

4. The method of claim 1, wherein each I/O operation is comprised of an I/O buffer and an I/O request packet, the I/O buffer being an area of memory to which data are written for input operations and from which data are read for output operations, and the I/O request packet specifying an I/O function and referencing one or more I/O buffers, the number of I/O buffers referenced by an I/O request packet indicated by a packet size, wherein each distribution parameter value further specifies a number of I/O operations to issue with I/O request packets of one or more packet sizes.

5. The method of claim 4, wherein each distribution parameter value is associated with a range of sizes of I/O request packets.

6. The method of claim 5, wherein each range of sizes if I/O request packets spans an equal number of words.

7. The method of claim 1, further comprising selecting CPUs that issue I/O operations in response to the performance characteristics relative to the target performance characteristics.

8. The method of claim 1, further comprising adjusting a ratio of I/O read operations to I/O write operations in response to the performance characteristics relative to the target performance characteristics.

9. The method of claim 1, further comprising selecting an order in which logical files are accessed by the I/O operations in response to the performance characteristics relative to the target performance characteristics.

10. The method of claim 1, wherein each I/O operation is comprised of an I/O buffer and an I/O request packet, the I/O buffer being an area of memory to which data are written for input operations and from which data are read for output operations, and the I/O request packet specifying an I/O function and referencing one or more I/O buffers, the number of I/O buffers referenced by an I/O request packet indicated by a packet size, wherein each distribution parameter value further specifies a number of I/O operations to issue with I/O request packets of one or more packet sizes, the method further comprising:

managing I/O buffers and I/O request packets associated with in-progress I/O operations in a first queue;

managing I/O buffers and I/O request packets that are available for use for an I/O operation in a second queue; and managing I/O buffers and I/O request packets associated with completed I/O operations that are undergoing verification in a third queue.

11. An apparatus for controlling a distribution of sizes of input/output (I/O) operations in testing a data processing system, comprising:

means for instantiating a plurality of sets of distribution parameter values, wherein the values in each set define a distribution that is unique relative to the other sets of values;

means for issuing a plurality of I/O operations of different sizes in response to a set of distribution parameter values, wherein each distribution parameter value specifies a number of I/O operations to issue for, one or more sizes of I/O operations;

means for verifying correct completion of the I/O operations;

means for measuring performance characteristics of the data processing system while issuing the I/O operations; and means for selectively adjusting, in response to the performance characteristics relative to target performance characteristics, the distribution parameter values, the means for selectively adjusting including means for selecting one of the sets of distribution parameter values in response to the performance characteristics relative to target performance characteristics.

12. An article of manufacture, comprising:

a computer readable medium configured with instructions for causing a computer to control a distribution of sizes of input/output (I/O) operations in testing a data processing system by performing the steps of:

instantiating a plurality of sets of distribution parameter values, wherein the values in each set define a distribution that is unique relative to the other sets of values;

issuing a plurality of I/O operations of different sizes in response to a set of distribution parameter values, wherein each distribution parameter value specifies a number of I/O operations to issue for one or more sizes of I/O operations;

verifying correct completion of the I/O operations;

measuring performance characteristics of the data processing system while issuing the I/O operations; and selectively adjusting, in response to the performance characteristics relative to target performance characteristics, the distribution parameter values, the selective adjustment including selecting one of the sets of distribution parameter values in response to the performance characteristics relative to target performance characteristics.

13. A computer-implemented method for controlling a distribution of sizes of input/output (I/O) operations in testing a data processing system, comprising:

establishing a plurality of sets of parameter values, wherein the values in each set define numbers of I/O operations for different sizes of I/O operations that are unique relative to the other sets of values;

establishing a set of target performance characteristics;

issuing a plurality of I/O operations of different sizes consistent with the set of parameter values;

measuring performance characteristics of the data processing system during processing of the I/O operations; and selectively adjusting the parameter values in response to the performance characteristics relative to target performance characteristics, the selective adjustment including selecting one of the sets of parameter values in response to the performance characteristics relative to target performance characteristics.

14. The method of claim 13, wherein each parameter value is associated with a range of sizes of I/O operations.

15. The method of claim 14, wherein each range of sizes spans an equal number of words.

16. An apparatus for controlling a distribution of sizes of input/output (I/O) operations in testing a data processing system, comprising:

means for establishing a plurality of sets of parameter values, wherein the values in each set define numbers of I/O operations for different sizes of I/O operations that are unique relative to the other sets of values;

means for establishing a set of target performance characteristics;

means for establishing a set of parameter values, wherein each parameter value specifies a number of I/O operations to issue for at least one size of I/O operation;

means for issuing a plurality of I/O operations of different sizes consistent with the set of parameter values;

means for measuring performance characteristics of the data processing system during processing of the I/O operations; and means for selectively adjusting the parameter values in response to the performance characteristics relative to target performance characteristics, the means for selectively adjusting including means for selecting one of the sets of parameter values in response to the performance characteristics relative to target performance characteristics.

* * * * *

UNITED STATES PATENT AND TRADEMARK OFFICE
CERTIFICATE OF CORRECTION

PATENT NO. : 6,879,939 B1
DATED : April 12, 2005
INVENTOR(S) : Michelle J. Lang et al.

It is certified that error appears in the above-identified patent and that said Letters Patent is hereby corrected as shown below:

Column 16,
Line 4, the term "," should be omitted.

Signed and Sealed this

Seventh Day of June, 2005

JON W. DUDAS
*Director of the United States Patent and Trademark Office*